United States Patent
Kang et al.

(10) Patent No.: US 7,218,548 B2
(45) Date of Patent: May 15, 2007

(54) SEMICONDUCTOR MEMORY DEVICE FOR LOW VOLTAGE

(75) Inventors: Hee-Bok Kang, Kyoungki-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/321,862

(22) Filed: Dec. 28, 2005

(65) Prior Publication Data

US 2006/0221666 A1    Oct. 5, 2006

(30) Foreign Application Priority Data

Mar. 31, 2005    (KR) ...................... 10-2005-0027357

(51) Int. Cl.
    *G11C 11/24*    (2006.01)
(52) U.S. Cl. ...................... 365/149; 365/196
(58) Field of Classification Search ................ 365/149, 365/196
    See application file for complete search history.

(56) References Cited

U.S. PATENT DOCUMENTS

| | | | |
|---|---|---|---|
| 5,262,982 A * | 11/1993 | Brassington et al. | ....... 365/145 |
| 5,349,560 A | 9/1994 | Suh et al. | |
| 5,483,482 A * | 1/1996 | Yamada et al. | ............. 365/175 |
| 5,848,015 A | 12/1998 | Seno | |
| 6,084,812 A | 7/2000 | Joo | |
| 6,456,547 B1 | 9/2002 | Mo et al. | |
| 2004/0136227 A1 * | 7/2004 | Enders et al. | ................ 365/149 |
| 2005/0030809 A1 | 2/2005 | Vimercati et al. | |
| 2005/0157527 A1 * | 7/2005 | Hirose et al. | .................. 365/63 |
| 2005/0265069 A1 * | 12/2005 | Forbes | ........................ 365/149 |
| 2006/0221664 A1 * | 10/2006 | Kang et al. | ................. 365/149 |

FOREIGN PATENT DOCUMENTS

JP    2004-337597    12/2004

* cited by examiner

*Primary Examiner*—Michael Tran
(74) *Attorney, Agent, or Firm*—Blakely Sokoloff Taylor & Zafman

(57) ABSTRACT

A semiconductor memory device includes a first cell block having a plurality of unit cells for providing a data signal included in a unit cell through a corresponding bit line pair; a plurality of bit line sense amplifying blocks for sensing and amplifying the data signal delivered to the corresponding bit line pair by using the power supply voltage and a low voltage which is lower than the ground voltage; a decoding unit for generating a plurality of decoding signals to provide the plurality of decoding signals into the plurality of bit line sense amplifying blocks respectively in order to deliver the sensed and amplified data signal to a data line; and a low voltage generation unit for generating the low voltage by using a parasitic capacitor generated at a signal line of the decoding signal as a storing capacitor.

15 Claims, 9 Drawing Sheets

SEMICONDUCTOR MEMORY DEVICE FOR LOW VOLTAGE

FIELD OF INVENTION

The present invention relates to a semiconductor memory device; and, more particularly, to a semiconductor memory device for efficiently operating at a low power supply voltage.

DESCRIPTION OF RELATED ART

Generally, a semiconductor memory device includes a plurality of unit cells for storing data. It is preferable that a size of each unit cell is designed as small as possible for increasing the number of the unit cells so that a data storing capacity can be increased.

In case of a dynamic random access memory (DRAM), each unit cell includes a capacitor for storing a data signal and a metal oxide semiconductor (MOS) transistor for serving as a switch. Herein, a size of the MOS transistor and a capacitance of the capacitor are designed as small as possible. Accordingly, signal strength of a data signal stored in a unit cell is very weak. Therefore, for outputting the data to the outside of the DRAM, the data should be amplified and latched in stages. For this operation, a sense amplifier is provided at each stage.

That is, a data stored in a unit cell is delivered to a bit line and, then, the data delivered to the bit line is amplified by a bit line sense amplifier and is latched to be transferred to an internal data line. Thereafter, the data transferred to the internal data line is sensed and amplified by an I/O (input/output) sense amplifier to be outputted to the outside through a data output buffer.

Meanwhile, the unit cells included in the semiconductor memory device are arranged in a matrix form and each unit cell is accessed by using an X-address and a Y-address. That is, a word line is selected by the X-address and a bit line is selected by the Y-address and, then, a data stored in a unit cell crossed by the selected word line and bit line is accessed. Herein, an X-decoder and a Y-decoder are provided for decoding the X-address and the Y-address respectively.

Recently, a plurality of banks are included in a semiconductor memory device, and each bank includes a plurality of unit cells, an X-decoder and a Y-decoder so that each bank can independently access a data for a high-speed data input/output operation.

FIG. 1 is a block diagram showing a conventional semiconductor memory device.

As shown, the conventional semiconductor memory device includes 4 banks and each bank includes an X-decoder and a Y-decoder.

If an address is inputted from an outside of the conventional semiconductor memory device, the inputted address is divided into an X-address and a Y-address to be respectively decoded by the X-decoder and the Y-decoder. Then, a word line and a bit line are selected according to the decoded X-address and Y-address. Accordingly, a data stored in a unit cell crossed by the selected word line and bit line is outputted.

FIG. 2 is a block diagram showing the Y-decoder shown in FIG. 1.

As shown, each Y-decoder includes a plurality of unit Y-decoders. The number of the unit Y-decoders is determined by the number of bit line pairs included in each bank. Herein, it is assumed that 4 unit Y-decoders, i.e., a first to a fourth unit Y-decoders, are included in each Y-decoder.

As above-mentioned, for manufacturing a more highly integrated semiconductor memory device, a capacitor and a MOS transistor included in a unit cell are designed as small as possible. Therefore, a leakage current of the MOS transistor is increased; and, since a leakage current of the capacitor is relatively more serious, a refresh operation should be performed more often and, thus, a high-speed operation of the semiconductor memory device is prevented.

Meanwhile, for efficiently operating a semiconductor memory device, a high voltage VPP generated by increasing a power supply voltage is used for performing several operations. For instance, the high voltage VPP is used for enabling an n-type metal oxide semiconductor (NMOS) transistor included in a unit cell in order to compensate a signal loss generated during transferring a high-level data signal. Also, the high voltage VPP is used for sensing and amplifying a data signal delivered to a bit line at a high speed.

However, as a technology is improved, a voltage level of the power supply voltage is lowered. Accordingly, it is more difficult to generate a high voltage by using the lowered power supply voltage. That is, an efficiency of generating the high voltage is decreased.

SUMMARY OF INVENTION

It is, therefore, an object of the present invention to provide a semiconductor memory device for improving a refresh operational characteristics by reducing a leakage current of a unit cell and for operating at a high speed under a low power supply voltage condition not using a high voltage.

In accordance with an aspect of the present invention, there is provided a semiconductor memory device supplied with a power supply voltage and a ground voltage for operating, including: a first cell block having a plurality of unit cells for providing a data signal included in a unit cell through a corresponding bit line pair, each unit cell being constituted with a PMOS transistor and a capacitor; a plurality of bit line sense amplifying blocks corresponding to a plurality of bit line pairs for sensing and amplifying the data signal delivered to the corresponding bit line pair by using the power supply voltage and a low voltage which is lower than the ground voltage; a decoding unit for generating a plurality of decoding signals and for providing the plurality of decoding signals to the plurality of bit line sense amplifying blocks respectively in order to deliver the sensed and amplified data signal to a data line; and a low voltage generation unit for generating the low voltage by using a parasitic capacitor generated at a signal line of the decoding signal as a storing capacitor.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
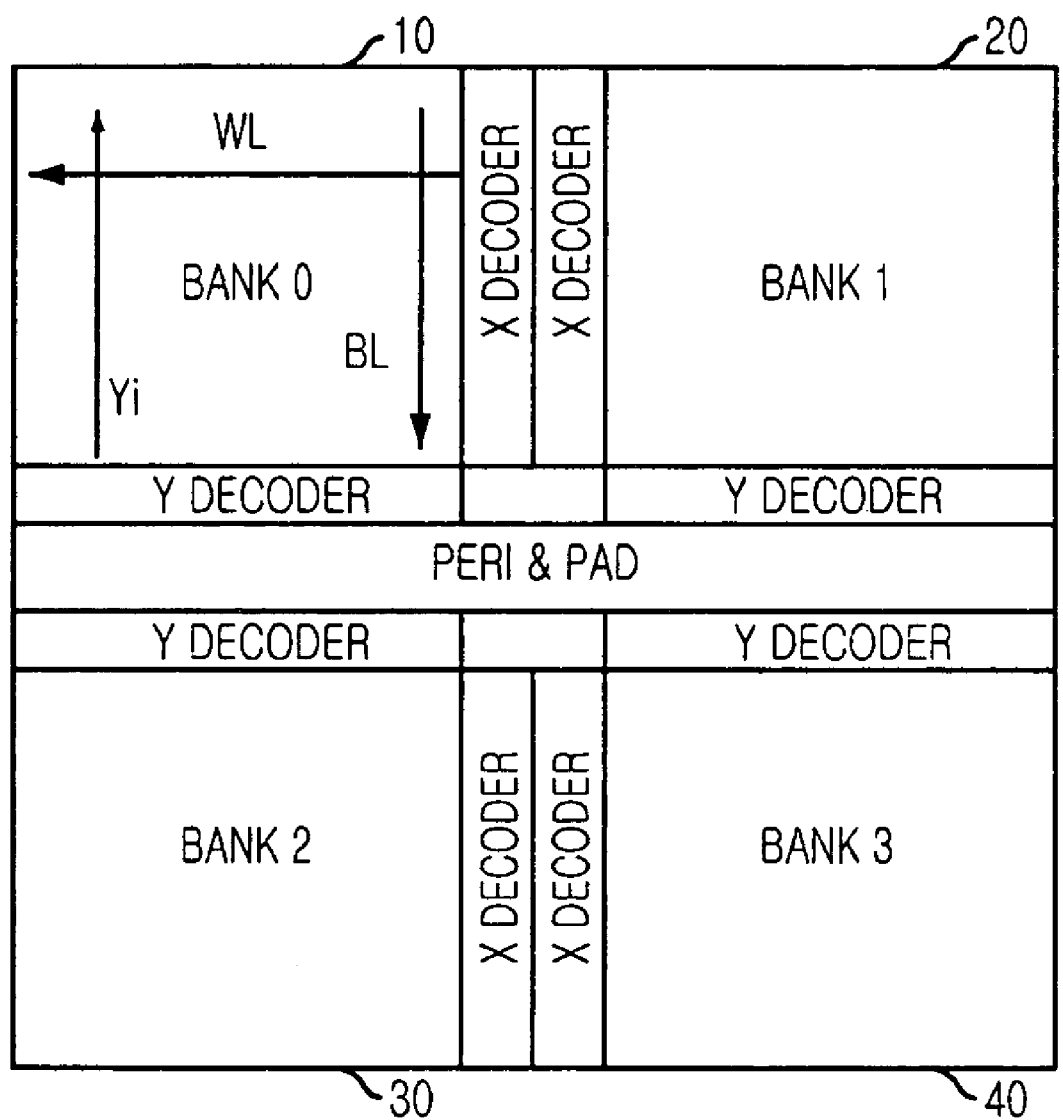
FIG. 1 is a block diagram showing a conventional semiconductor memory device.
Figure 2:
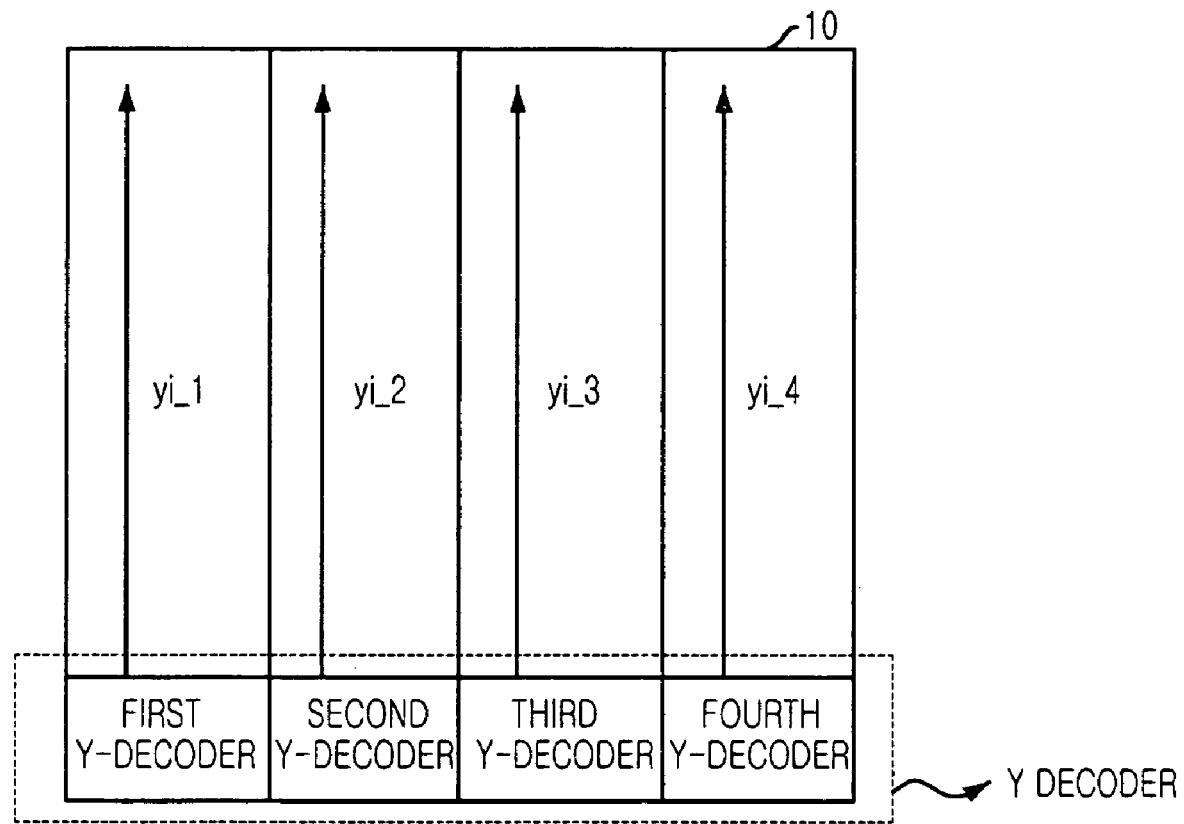
FIG. 2 is a block diagram showing the Y-decoder shown in FIG. 1.
Figure 3:
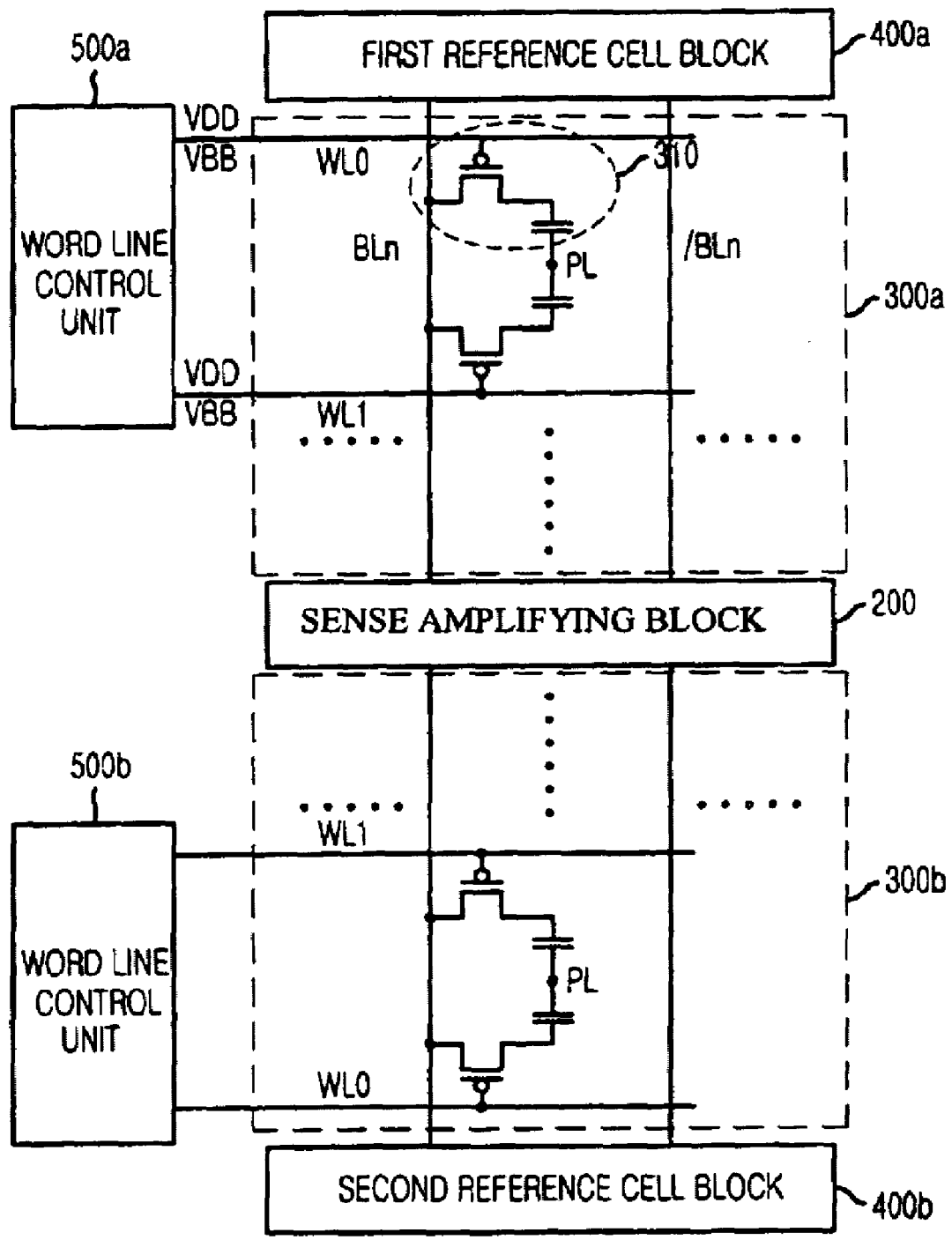
FIG. 3 is a block diagram showing a semiconductor memory device in accordance with a preferred embodiment of the present invention.

FIG. 3 is a block diagram showing a semiconductor memory device in accordance with a preferred embodiment of the present invention.

As shown, the semiconductor memory device includes a plurality of cell arrays, e.g., 300a and 300b, each of which includes a plurality of unit cells, e.g., 310. Each unit cell is constituted with a p-type metal oxide semiconductor (PMOS) transistor and a capacitor, and a gate of the PMOS transistor is coupled to a word line, e.g., WL0 and WL1.

Accordingly, each unit cell receives a low voltage VBB to be enabled or receives a power supply voltage VDD to be disabled through the word line. For this operation, the semiconductor memory device further includes a word line control unit, e.g., 500a and 500b, for activating or inactivating the word line. That is, the word line control unit supplies the low voltage VBB to a word line selected by an inputted address and supplies the power supply voltage VDD to unselected word lines.

Herein, due to characteristics of the PMOS transistor, a signal loss is generated during transferring a low-level data. For this reason, the low voltage VBB is used for driving the word line in order to compensate the signal loss. That is, during transferring a low-level data, an amount of a threshold voltage of the PMOS transistor is lost. Therefore, the low voltage VBB for driving the word line is lower than a ground voltage by an amount of an absolute value of the threshold voltage. For instance, if the threshold voltage is about 0.7V, the low voltage VBB is about −0.7V or lower than −0.7V. However, for practical purposes, it is preferable that the low voltage VBB has a voltage level of about −2.0V for more surely turning on/off the PMOS transistor.

Meanwhile, the semiconductor memory device further includes a sense amplifying block 200 for sensing and amplifying a data signal loaded on a bit line pair. The sense amplifying block 200 is shared by two neighboring cell arrays, i.e., 300a and 300b. For this purpose, a connection unit for connecting the cell arrays to the sense amplifying block 200 is provided.

In accordance with the present invention, a bit line is floated not being supplied with a particular precharge voltage during a precharge operation. Therefore, a first and a second reference blocks 400a and 400b are further included in the semiconductor memory device for providing a reference signal to a bit line bar which corresponds to a bit line so that a bit line sense amplifier included in the sense amplifying block 200 can correctly sense a data signal loaded on the bit line.

Meanwhile, the PMOS transistor included in a unit cell can be formed as a conventional MOS transistor whose channel is formed under a gate pattern. Also, the PMOS transistor can be formed as a recently developed finFET-type MOS transistor. In the finFET-type MOS transistor, a drain and a source are connected as a fin pattern and the connected fin pattern is wrapped. Since a channel is formed at three sides of the fin, the finFET-type MOS transistor can be more surely turned on/off.

Figure 4:
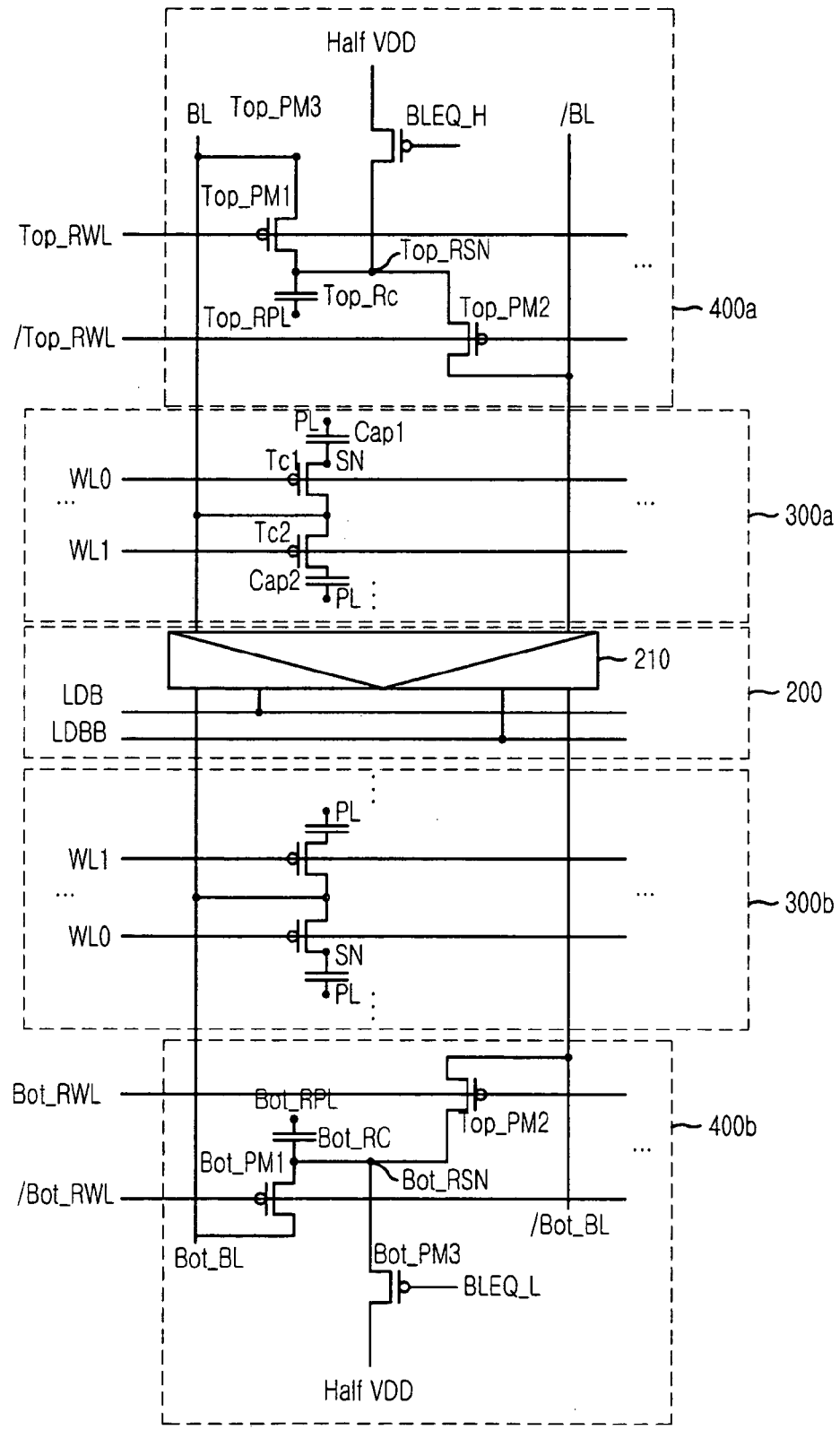
FIG. 4 is a schematic circuit diagram depicting the semiconductor memory device shown in FIG. 3.

FIG. 4 is a schematic circuit diagram depicting the semiconductor memory device shown in FIG. 3, particularly the first and the second reference cell blocks 400a and 400b.

Figure 5:
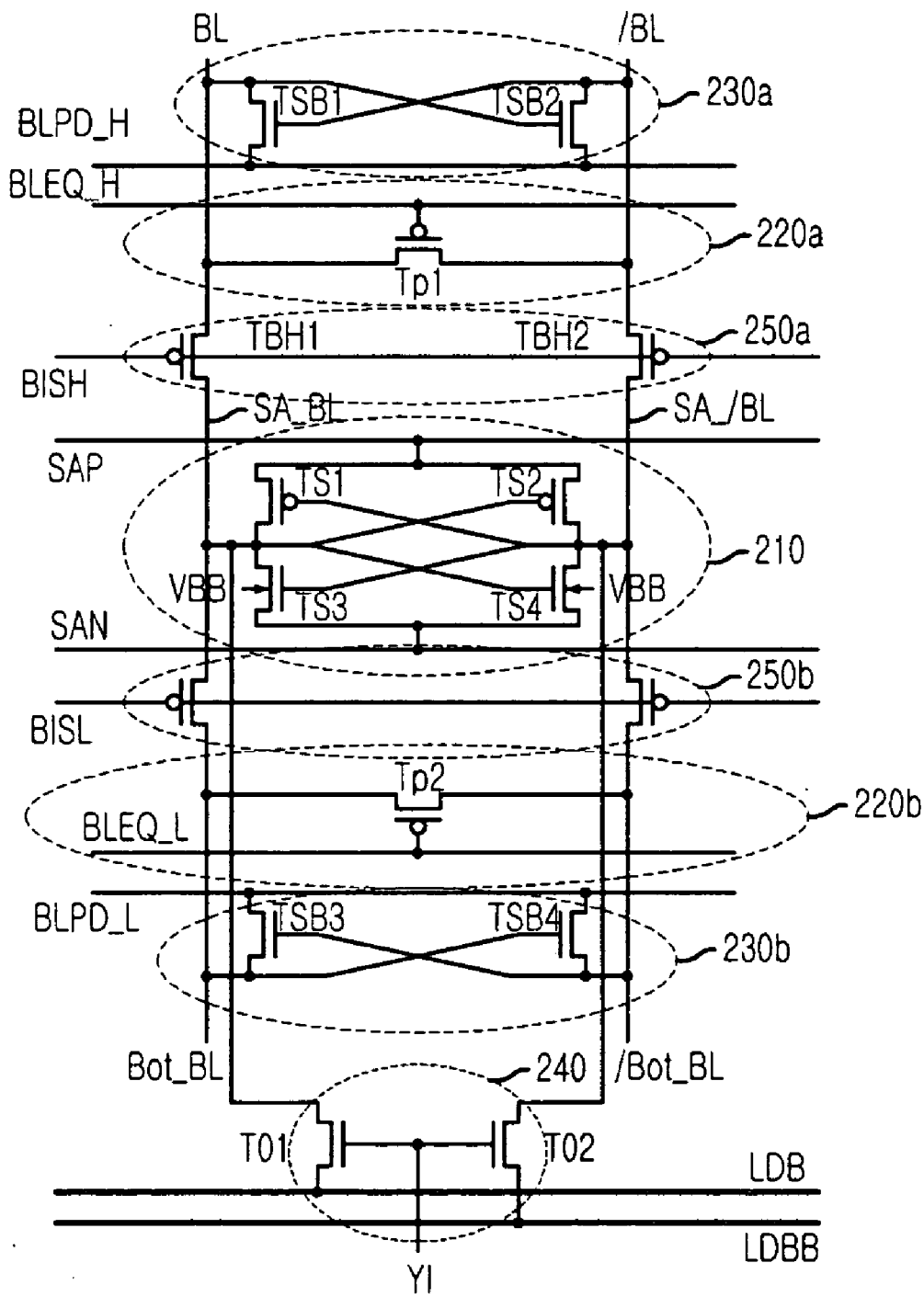
FIG. 5 is a schematic circuit diagram showing the amplifying block shown in FIG. 3.

FIG. 5 is a schematic circuit diagram showing the amplifying block 200 shown in FIG. 3.

Referring to FIGS. 4 and 5, the semiconductor memory device has a folded bit line structure and the semiconductor memory device receives a power supply voltage VDD and a ground voltage VSS for operating and includes a plurality of unit cells each having a PMOS transistor and a capacitor.

In detail, the semiconductor memory device includes a first cell array 300a for storing data and for outputting a data signal to a first bit line BL or a first bit line bar /BL; a sense amplifying block 200 having a bit line sense amplifier 210 for sensing and amplifying the data signal loaded on one of the first bit line BL and the first bit line bar /BL by amplifying a potential difference between the first bit line BL and the first bit line bar /BL; and a first reference cell block 400a for inputting a reference signal to the first bit line bar /BL when the data signal is outputted to the first bit line BL or to the first bit line BL when the data signal is outputted to the first bit line bar /BL.

The sense amplifying block 200 further includes a first precharge unit 220a for equalizing a potential difference between the first bit line BL and the first bit line bar /BL coupled to the first cell array 300a at a precharge operation. That is, the first precharge unit 220a floats the first bit line BL and the first bit line bar /BL by not supplying a precharge voltage to the first bit line BL and the first bit line bar /BL at the precharge operation. Herein, the first precharge unit 220a includes a first PMOS transistor Tp1 for connecting the first bit line BL to the first bit line bar /BL at the precharge operation.

The first reference cell block 400a includes a reference capacitor Top_RC whose one terminal is coupled to a reference power supply terminal Top_RPL; a first reference switching PMOS transistor Top_PM1 for connecting the other terminal of the reference capacitor Top_RC to the first bit line BL when a data signal is delivered to the first bit line bar /BL; and a second reference switching PMOS transistor Top_PM2 for connecting the other terminal of the reference capacitor Top_RC to the first bit line bar /BL when a data signal is delivered to the first bit line BL.

Herein, a capacitance of the reference capacitor Top_RC is substantially same to that of a unit cell capacitor, e.g., Cap1, included in the first cell array 300a. A voltage supplied from the reference power supply terminal Top_RPL is one of the ground voltage VSS, a half of the power supply voltage VDD and the power supply voltage VDD.

The number of reference capacitors included in the first reference cell block 400a corresponds to the number of bit line pairs included in a corresponding cell array, i.e., the first cell array 300a. For instance, if the first cell array 300a includes 256 bit line pairs, the first reference cell block 400a includes 256 reference capacitors. Each reference capacitor is coupled to one of a corresponding bit line pair which carries no data signal to thereby deliver a reference signal stored in the reference capacitor to the coupled bit line.

Meanwhile, the sense amplifying block 200 further includes a first connection unit 250a connected between the bit line sense amplifier 210 and the first precharge unit 220a for connecting/disconnecting the first bit line BL and the first bit line bar /BL included in the first cell array 300a to/from the bit line sense amplifier 210.

The first connection unit 250a includes a second PMOS transistor TBH1 for connecting the first bit line BL to the bit line sense amplifier 210 in response to a first connection control signal BISH; and a third PMOS transistor TBH2 for connecting the first bit line bar /BL to the bit line sense amplifier 210 in response to the first connection control signal BISH.

Also, the sense amplifying block 200 further includes a first auxiliary bit line sense amplifier 230a for amplifying and maintaining a voltage level of one of the first bit line BL and the first bit line bar /BL included between the first cell array 300a and the first connection unit 250a, which has a smaller voltage level than the other, as a voltage level of the ground voltage VSS. A signal BLEQ_H inputted to the first auxiliary bit line sense amplifier 230a has a voltage level of the ground voltage VSS while the bit line sense amplifier is operated.

In detail, the first auxiliary bit line sense amplifier 230a includes a first auxiliary MOS transistor TSB1 and a second auxiliary MOS transistor TSB2.

One terminal of the first auxiliary MOS transistor TSB1 receives a signal BLPD_H which is activated when the bit line sense amplifier 210 is enabled and the other terminal is coupled to the first bit line BL connected between the first cell array 300a and the first connection unit 250a. A gate of the first auxiliary MOS transistor TSB1 is coupled to the first bit line bar /BL connected between the first cell array 300a and the first connection unit 250a. Similarly, one terminal of the second auxiliary MOS transistor TSB2 receives the signal BLPD_H which is activated when the bit line sense amplifier 210 is enabled and the other terminal is coupled to the first bit line bar /BL connected between the first cell array 300a and the first connection unit 250a. A gate of the second auxiliary MOS transistor TSB2 is coupled to the first bit line BL connected between the first cell array 300a and the first connection unit 250a.

Meanwhile, in accordance with the preferred embodiment, a cell array has a folded structure and also has a shared structure, i.e., a bit line sense amplifier is shared by two neighboring cell arrays. For this purpose, the semiconductor memory device further includes a second cell array 300b coupled to the other side of the bit line sense amplifier 210; and a second connection unit 250b for connecting/disconnecting the second cell array 300b to/from the bit line sense amplifier 210.

Similar to the first cell array 300a, the second cell array 300b stores data and outputs a data signal to a selected second bit line Bot_BL or second bit line bar /Bot_BL. The second connection unit 250b connects/disconnects the second bit line Bot_BL and the second bit line bar /Bot_BL to/from the bit line sense amplifier 210.

Herein, the semiconductor memory device further includes a second reference cell block 400b for transferring a reference signal to the second bit line bar /Bot_BL when the data signal is outputted to the second bit line Bot_BL or to the second bit line Bot_BL when the data signal is outputted to the second bit line bar /Bot_BL; and a second precharge unit 220b for equalizing a potential difference between the second bit line Bot_BL and the second bit line bar /Bot_BL included in the second cell array 300b at the precharge operation. That is, the second precharge unit 220b floats the second bit line Bot_BL and the second bit line bar /Bot_BL not proving a particular precharge voltage to the second bit line Bot_BL and the second bit line bar /Bot_BL at the precharge operation. Herein, the second precharge unit 220b includes a fourth PMOS transistor Tp2 for connecting the second bit line Bot_BL to the second bit line bar /Bot_BL at the precharge operation.

Meanwhile, the sense amplifying block 200 further includes a second auxiliary bit line sense amplifier 230b connected between the second cell array 300b and the bit line sense amplifier 210 for amplifying and maintaining a voltage level of one of the second bit line Bot_BL and the second bit line bar /Bot_BL included between the second cell array 300b and the second connection unit 250b, which has a smaller voltage level than the other, as a voltage level of the ground voltage VSS.

In detail, the second auxiliary bit line sense amplifier 230b includes a first auxiliary NMOS transistor TSB3 and a second auxiliary NMOS transistor TSB4.

One terminal of the first auxiliary NMOS transistor TSB3 receives a signal BLPD_L which is activated when the bit line sense amplifier 210 is enabled and the other terminal is coupled to the second bit line Bot_BL connected between the second cell array 300b and the second connection unit 250b. A gate of the first auxiliary NMOS transistor TSB3 is coupled to the second bit line bar /Bot_BL connected between the second cell array 300b and the second connection unit 250b. Similarly, one terminal of the second auxiliary NMOS transistor TSB4 receives the signal BLPD_L which is activated when the bit line sense amplifier 210 is enabled and the other terminal is coupled to the second bit line bar /Bot_BL connected between the second cell array 300b and the second connection unit 250b. A gate of the second auxiliary NMOS transistor TSB4 is coupled to the second bit line Bot_BL connected between the second cell array 300b and the second connection unit 250b.

Meanwhile, the bit line sense amplifier 210 includes a first and a second sense amplifying PMOS transistors TS1 and TS2 and a first and a second sense amplifying NMOS transistors TS3 and TS4.

A gate of the first sense amplifying PMOS transistor TS1 is connected to the first bit line bar /BL by the first connection unit 250a or to the second bit line bar /Bot_BL by the second connection unit 250b. One terminal of the first sense amplifying PMOS transistor TS1 receives the power supply voltage VDD and the other terminal is connected to the first bit line BL by the first connection unit 250a or to the second bit line Bot_BL by the second connection unit 250b.

Similarly, a gate of the second sense amplifying PMOS transistor TS2 is connected to the first bit line BL by the first connection unit 250a or to the second bit line Bot_BL by the second connection unit 250b. One terminal of the second sense amplifying PMOS transistor TS2 receives the power supply voltage VDD and the other terminal is connected to the first bit line bar /BL by the first connection unit 250a or to the second bit line bar /Bot_BL by the second connection unit 250b.

A gate of the first sense amplifying NMOS transistor TS3 is connected to the first bit line bar /BL by the first connection unit 250a or to the second bit line bar /Bot_BL by the second connection unit 250b. One terminal of the first sense amplifying NMOS transistor TS3 receives a first low voltage VBB and the other terminal is connected to the first bit line BL by the first connection unit 250a or to the second bit line Bot_BL by the second connection unit 250b.

Similarly, a gate of the second sense amplifying NMOS transistor TS4 is connected to the first bit line BL by the first connection unit 250a or to the second bit line Bot_BL by the second connection unit 250b. One terminal of the second sense amplifying NMOS transistor TS4 receives the first low voltage VBB and the other terminal is connected to the first bit line bar /BL by the first connection unit 250a or to the second bit line bar /Bot_BL by the second connection unit 250b.

Herein, the first low voltage VBB has a lower voltage level than the ground voltage VSS having a voltage level of about −0.5V. The bit line sense amplifier 210 performs a sensing and amplifying operation by using the first low voltage VBB and the power supply voltage VDD.

Meanwhile, the PMOS transistor included in a unit cell, e.g., TC1, is turned on in response to a second low voltage VBBW which is lower than the first low voltage VBB having a voltage level of about −2.0V. A selected unit cell included in the first cell array 300a is activated by turning on a PMOS transistor included in the selected unit cell by using the second low voltage VBBW and the selected unit cell is inactivated by turning off the PMOS transistor by using the power supply voltage VDD.

Meanwhile, the semiconductor memory device further includes a data input/output unit 240 for outputting a data sensed and amplified by the bit line sense amplifier 210 through a data line (LDB, LDBB) and for delivering a data inputted from the data line to the bit line sense amplifier 210.

In detail, the data input/output unit 240 includes a first and a second input/output MOS transistors TO1 and TO2. A gate of the first input/output MOS transistor TO1 receives an input/output control signal. One terminal of the first input/output MOS transistor TO1 is connected to the first and the second bit lines BL and Bot_BL and the other terminal of the first input/output MOS transistor TO1 is coupled to a first data line LDB. Similarly, a gate of the second input/output MOS transistor TO2 receives the input/output control signal; and one terminal of the second input/output MOS transistor TO2 is connected to the first and the second bit line bars /BL and /Bot_BL and the other terminal of the second input/output MOS transistor TO2 is coupled to a second data line LDBB.

Figure 6:
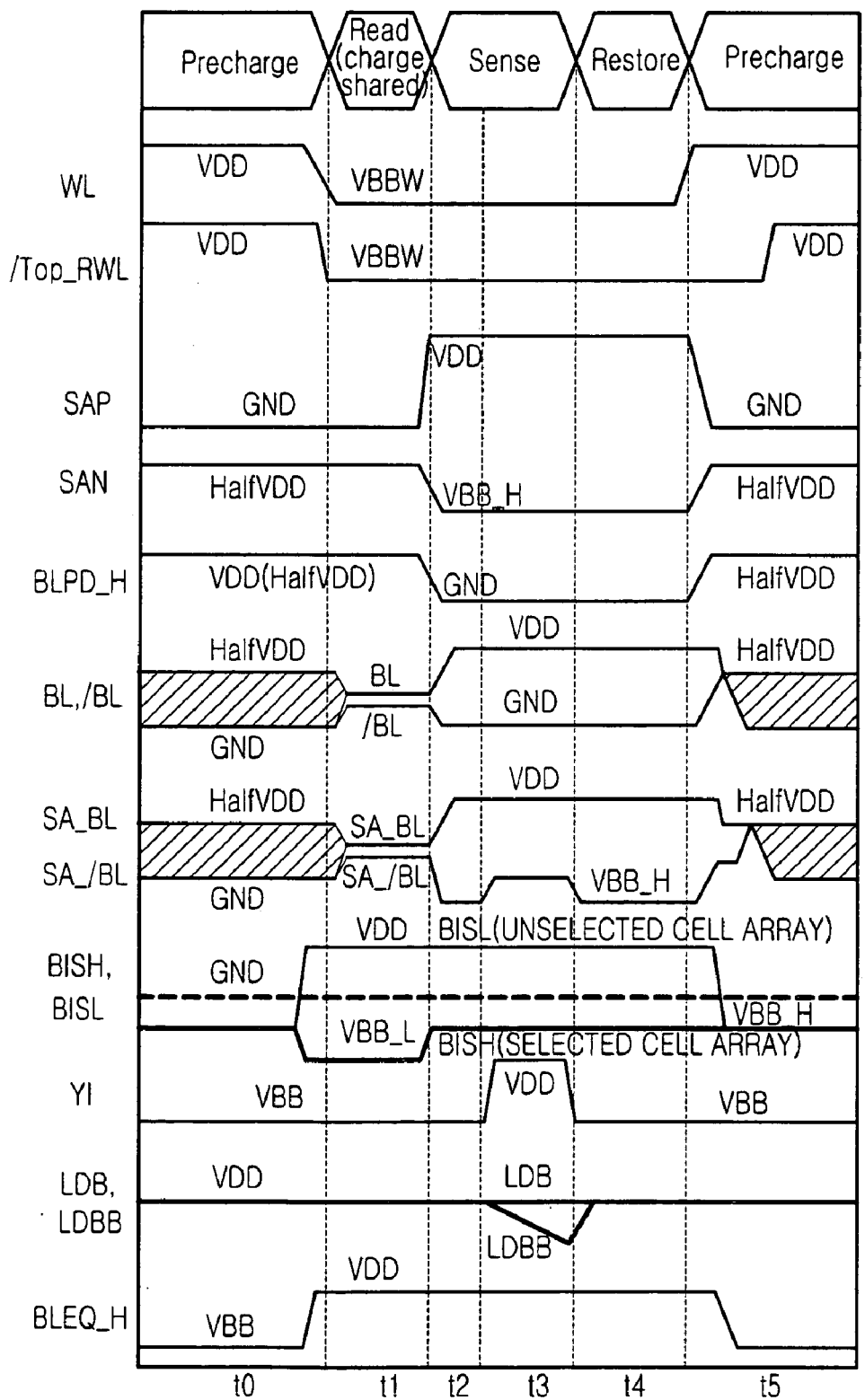
FIG. 6 is a timing diagram showing an operation of the semiconductor memory device shown in FIGS. 3 to 5.

FIG. 6 is a timing diagram showing an operation of the semiconductor memory device shown in FIGS. 3 to 5.

Referring to FIGS. 3 to 6, the operation of the semiconductor memory device is described below.

In accordance with the preferred embodiment of the present invention, a distinguishing feature of the semiconductor memory device is that a unit cell included in a cell array is constituted with a PMOS transistor and a capacitor. Accordingly, a low level voltage is supplied for activating a word line and a high level voltage is supplied for inactivating a word line. That is, the low voltage VBBW having a voltage level of about −2.0V is supplied for activating a word line and the power supply voltage VDD is supplied for inactivating a word line.

Also, the first and the second connection units 250a and 250b and the first and the second precharge units 220a and 220b are constituted with a PMOS transistor. Therefore, a PMOS transistor included in the first and the second connection units 250a and 250b and the first and the second precharge units 220a and 220b can be disposed at n-well which is laid out for a unit cell included in a cell array.

Also, the semiconductor memory device floats a bit line and a bit line bar by not providing a precharge voltage to the bit line and the bit line bar at the precharge operation. For this purpose, a reference cell bock is included.

Also, as above-mentioned, the bit line sense amplifier performs a sensing and amplifying operation by using the power supply voltage VDD and the low voltage VBB which is lower than the ground voltage GND.

In this case, if a voltage level of the power supply voltage is more decreased, it is possible that an absolute quantity of the power supply voltage VDD is equal to that of the low voltage VBB. In this case, a precharge voltage level of a bit line can be maintained as the ground voltage VSS if voltage levels of two bit lines are controlled to be same after a sensing operation of the bit line sense amplifier.

Meanwhile, as above-mentioned, the semiconductor memory device includes an auxiliary bit line sense amplifier for maintaining a voltage level of a neighboring bit line pair as a half of VDD by using a reference cell block and a precharge unit when the bit line sense amplifier is operated for a data access.

Hereinafter, the above-mentioned operations of the semiconductor memory device are described in detail. Herein, it is assumed that a read operation is performed for reading a high-level data '1', and the data is transferred to the first bit line BL.

A data access operation of the semiconductor memory device can be split into four steps: a precharge step, a read/write step, a sense step and a restore step.

At the precharge step, precharge signals BLEQ_H and BLEQ_L are activated as the voltage level of the low voltage VBB and, thus, voltage levels of the first bit line BL and the first bit line bar /BL of the first cell array 300a are equalized and voltage levels of a first bit line Top_BL and a second bit line bar Top_/BL are also equalized.

As above-mentioned, since a particular precharge voltage is not provided at the precharge step, bit line pairs BL and /BL, SA_BL and SA_/BL and Bot_BL and /Bot_BL are floated (t0). At this time, the first and the second connection units 250a and 250b are turned on and the power supply voltage VDD is supplied to all of inactivated word lines.

Therefore, the bit line pairs BL and /BL, SA_BL and SA_/BL and Bot_BL and /Bot_BL keep a voltage level of about half of the power supply voltage VDD at the precharge step by using enabled precharge units 220a and 220b right after a read/write operation is performed (After a sensing and amplifying operation is performed by the bit line sense amplifier, one of a bit line pair has a voltage level of the power supply voltage VDD and the other has a voltage level of the ground voltage GND). Thereafter, since a particular precharge voltage is not provided, the bit line voltage level of half of the power supply voltage VDD is decreased if a period of the precharge step is longer. If the precharge step is more continuously performed not entering the read step, the voltage level of the bit line pairs BL and /BL and SA_BL and SA_/BL is decreased to the ground voltage GND.

Therefore, a precharge voltage of a floated bit line may have a variable voltage level between the half of the power supply voltage VDD and the ground voltage GND. As a result, a timing of performing the read step determines the voltage level of the floated bit line.

Thereafter, at the read step, a single word line is selected by decoding an inputted address. The selected word line is supplied with the second low voltage VBBW to be activated. As above-mentioned, a signal loss is generated during transferring a low-level data. That is, the low-level data loses an amount of a threshold voltage of a PMOS transistor included in a unit cell while the low-level data is transferred through the PMOS transistor. Therefore, an absolute quantity of a voltage level of the second low voltage VBBW is greater that that of a threshold voltage of the PMOS transistor for compensating the signal loss. Herein, for more surely turning on/off the PMOS transistor, it is assumed that the second low voltage VBBW has a voltage level of about −2.0V. All the PMOS transistors corresponding to the selected word line are turned on and a data stored in a capacitor is transferred to the bit line BL through a turned-on PMOS transistor.

If the data, i.e., '1', is delivered to the bit line BL, voltage levels of the bit lines BL and SA_BL, which have a voltage level between the half of the power supply voltage VDD and the ground voltage GND as above-mentioned, are increased by an amount of a signal level of the data (t1).

Meanwhile, a reference signal is inputted to the bit lines /BL and SA_/BL which have no data signal. A reference word line /Top_RWL having no data signal is activated as the second low voltage VBBW and, thus, a reference MOS transistor Top_PM2 is turned on. Accordingly, the reference signal stored in the reference capacitor Top_RC is transferred to the bit lines /BL and SA_/BL and, thus, voltage levels of the bit lines /BL and SA_/BL are increased by an amount of a predetermined voltage level. At this time, similar to the bit lines BL and SA_BL, voltage levels of the bit lines /BL and SA_/BL is decreased from the half of the power supply voltage before the input of the reference signal and, then, voltage levels of the bit lines /BL and SA_/BL are increased by an amount of a signal level of the reference signal. Herein, the, bit lines /BL and SA_/BL are increased from the same voltage levels of the bit lines BL and SA_BL.

As above-mentioned, a capacitance of the reference capacitor Top_RC is substantially same to that of a unit cell capacitor Cap. A charge amount of the reference capacitor Top_RC which stores the reference signal is half of a charge amount of the unit cell capacitor Cap which stores the data '1'. That is, since reference power supply terminals, i.e., Half VDD, Top_RPL and Bot_RPL, are supplied with a voltage level of VDD/2, a charge amount of the reference capacitor Top_RC which stores the reference signal is half of a charge amount of the unit cell capacitor Cap which stores the data '1'. At this time, a voltage level supplied by the reference power supply terminals Top_RPL and Bot_RPL is same to a voltage level of a plate voltage PL of a unit cell capacitor included in a cell array. At this time, the voltage level can have a voltage level of VDD, VDD/2 or GND. A voltage level which is same to the plate voltage PL is supplied to a reference signal power supply terminal VCP so that the reference signal can have a half signal level of the data signal.

Accordingly, a signal level increase of the bit line bar /BL which receives the reference signal is half of that of the bit line BL which receives the data signal. For instance, when the power supply voltage is 1.0V and there is a voltage increase by 0.2V due to the data signal, the bit lines BL and /BL have a voltage level of about 0.5V at an initial state of the precharge step. Thereafter, as the precharge step is continued, a voltage level of the bit lines BL and /BL is decreased to about 0.3V. At this time, if a read command is performed, a voltage level of the bit line BL having the data signal is increased to about 0.5V (=0.3V+0.2V) and a voltage level of the bit line bar /BL having the reference signal is increased to about 0.4V (=0.3V+0.1V).

Meanwhile, the precharge signal BLEQ_H is inputted as an activated state having a voltage level of the low voltage VBB in order to enable the first precharge unit 220a during the precharge step and is inputted as an inactivated state having a voltage level of the power supply voltage in order to disable the first precharge unit 220a during the read, sense and restore steps.

Next, at the sense step, a first sense amplifier power supply terminal SAP of the bit line sense amplifier 210 receives the power supply voltage VDD and a second sense amplifier power supply terminal SAN receives the low voltage VBB.

Therefore, the bit line sense amplifier 210 senses a voltage difference between the bit lines BL and /BL to thereby amplify a voltage level of a bit line having a higher voltage level, i.e., the bit line BL, to a voltage level of a power supply voltage VPP and amplify a voltage level of the bit line bar /BL to the ground voltage GND; and the amplified bit line BL and bit line bar /BL are lathced (t2).

Since the bit line sense amplifier 210 performs the amplifying operation by using the power supply voltage VPP and the low voltage VBB, the amplifying operation can be performed at a high speed in comparison with using the power supply voltage VDD and the ground voltage GND.

Herein, a voltage level of the bit line SA_/BL included between the bit line sense amplifier 210 and the second connection unit 250b is amplified to the negative low voltage VBB; however, the bit line /BL included between the first cell array 300a and the first connection unit 250a is amplified to the ground voltage GND. Since the first connection control signal BISH inputted to each gate of the second and the third PMOS transistors TBH1 and TBH2 included in the first connection unit 250a has a voltage level of a low voltage VBB_H, even though the bit line SA_/BL coupled to the bit line sense amplifier 210 is amplified to the low voltage, the bit line /BL coupled to the first cell array 300a is amplified to the ground voltage which is higher than the low voltage.

Accordingly, the second connection unit 250b performs a clamping operation so that a low voltage level is not transferred to the second cell array 300b even though the bit line sense amplifier 210 amplifies the bit line SA_/BL to the low voltage VBB. Also, since a parasitic capacitance caused by the bit line /BL coupled to the first cell array 300a is relatively larger than a sub-threshold voltage of the second and the third PMOS transistors TBH1 and TBH2 included in the first connection unit 250a, the bit line /BL coupled to the cell array can keep a voltage level of the ground voltage GND during the sensing and amplifying operation of the bit line sense amplifier 210 and the restore step.

In accordance with the preferred embodiment of the present invention, a unit cell is not constituted with an NMOS transistor and a capacitor but is constituted with a PMOS transistor and a capacitor. Therefore, even though the bit lines BL and /BL coupled to a cell array are supplied with a negative voltage, the PMOS transistor included in the unit cell is not turned on and, thus, a data included in the unit cell is not damaged.

However, since the bit lines BL and /BL coupled to a cell array can keep a voltage level of the ground voltage by preventing the low voltage VBB amplified by the bit line sense amplifier 210 from being transferred to the bit lines BL and /BL, a voltage variation of a bit line is prevented and, thus, an operational speed of the bit line sense amplifier 210 can be improved and a power consumption due to a voltage variation of a bit line coupled to a cell array can be reduced. For this purpose, the first and the second connection units 250a and 250b are included in the semiconductor memory device not only for controlling the connection between the bit line sense amplifier 210 and a cell array but also for preventing a low voltage VBB_H from being transferred to the bit lines BL, /BL, Top_BL and /Top_BL included in a cell array.

However, the first and the second connection units 250a and 250b are not enough for stably maintaining a voltage level of the bit lines BL and /BL included in a cell array as the ground voltage GND. Therefore, the first and the second auxiliary bit line sense amplifier 230a and 230b are provided for maintaining a voltage level of the bit lines BL and /BL included in a cell array as the ground voltage GND even though the bit lines SA_BL and SA_/BL coupled to the bit lines sense amplifier 210 are amplified to the negative low voltage VBB_H.

The auxiliary bit line sense amplifier, e.g., 230a, amplifies or maintains one of the bit lines BL and /BL included in the first cell array 300a, which has a lower voltage level than the other, as the ground voltage level while the bit line sense amplifier 210 performs the sensing and amplifying operation. When the bit line sense amplifier 210 amplifies a voltage level of the bit line SA_BL to the power supply voltage VDD and amplifies a voltage level of the bit line SA_/BL to the low voltage VBB, the bit line BL keeps a voltage level of the power supply voltage and the bit line bar /BL keeps a voltage level of the ground voltage GND. At this time, the auxiliary bit line sense amplifier 230a decreases a voltage level of the bit line bar /BL to the ground voltage GND when a voltage level of the bit line bar /BL is higher than the ground voltage GND and increases a voltage level of the bit line bar /BL to the ground voltage GND when a voltage level of the bit line bar /BL is lower than the ground voltage GND.

The signals BLPD_H and BLPD_L respectively inputted to the first and the second auxiliary bit line sense amplifiers 230a and 230b are activated as the ground voltage during an activation period of the bit line sense amplifier 210 (t2, t3, t4). As above-mentioned, gates of two MOS transistors included in the auxiliary bit line sense amplifier, e.g., TSB1 and TSB2, are cross-coupled to the bit lines BL and /BL and each one terminal of the MOS transistors receives the ground voltage to thereby maintain a voltage level of a lower bit line to the ground voltage.

In case that a unit cell included in a cell array is constituted with an NMOS transistor and a capacitor, if low voltage VBB is transferred to the bit line included in the cell array when the bit line sense amplifier 210 amplifies a bit line pair to the power supply voltage and the low voltage VBB, an NMOS transistor in a unit cell is turned on and, thus, a data of an unselected unit cell may be lost. Therefore, it is required that a low voltage amplified by the bit line sense amplifier is not delivered to a bit line included in a cell array while the bit line sense amplifier is operated.

A detailed description for this operation is included in the Korean patent application No. 2004-87659, filed in the Korean Patent Office on Oct. 30, 2004 by the same applicant.

However, as above-mentioned, in accordance with the present invention, since a unit cell is constituted with a PMOS transistor and a capacitor, even though the bit line sense amplifier 210 amplifies a bit line to a low voltage and the low voltage is transferred to a cell array, the PMOS transistor included in the unit cell is not turned on. Therefore, it is not necessary to separate a bit line amplified by the bit line sense amplifier 210 and a bit line included in the cell array. Accordingly, the auxiliary bit line sense amplifier for maintaining the bit line of the cell array as the ground voltage is not necessary for a digital operation.

However, in this case, i.e., if a voltage level of the bit line included in the cell array is decreased to the low voltage, a voltage level of a bit line should be decreased to the low voltage at once and, thus, a driving strength of the bit line sense amplifier 210 should be increased. Therefore, a power consumption of a power supplier for generating the low voltage is increased.

In accordance with the preferred embodiment of the present invention, the bit line sense amplifier 210 amplifies a bit line coupled the bit line sense amplifier 210 to the low voltage not amplifying a bit line coupled to a cell array. Therefore, since the power supplier for generating the low voltage is used only when a bit line is amplified to the low voltage VBB from the ground voltage GND after the bit line becomes the ground voltage GND. Accordingly, a power consumption is greatly reduced in comparison with the above-mentioned case.

In accordance with the preferred embodiment of the present invention, since the semiconductor memory device can be normally operated even though a bit line is supplied with the low voltage VBB, the bit line sense amplifier 210 can drive a bit line included in a cell array by using the low voltage VBB. In this case, the auxiliary bit line sense amplifier is not indispensable and if an efficiency of the power supplier for generating the low voltage is decreased, the low voltage VBB can be supplied to the bit line included in the cell array through the auxiliary bit line sense amplifier.

Meanwhile, each connection control signal inputted to the first and the second connection unit 250a and 250b has two voltage levels: one is a low voltage VBB_L having a negative voltage level whose absolute quantity is larger than a threshold voltage of a PMOS transistor included in the first and the second connection units 250a and 250b and the other is a low voltage VBB_H having a negative voltage level whose absolute quantity is equal to the threshold voltage of a PMOS transistor included in the first and the second connection units 250a and 250b.

The first and the second connection control signals BISH and BISL are inputted as the low voltage VBB_H for equalizing voltage levels of a bit line pair included in the first and the second cell arrays 300a 300b, i.e., the bit line pair BL and /BL, during the precharge step.

At the read step, wherein the first cell array 300a is connected to the bit line sense amplifier 210 and the second cell array 300b is disconnected from the bit line sense amplifier 210, the second connection control signal BISL is inactivated having the power supply voltage VDD to disable the second connection unit 250b and the first connection control signal BISH is activated having a voltage level of the low voltage VBB_L to enable the first connection unit 250a. Thereafter, at the sense step where the bit line sense amplifier 210 senses and amplifies a voltage difference between bit lines SA_BL and SA_/BL and the restore step, the activated first connection control signal BISH is provided as the low voltage VBB_H.

Therefore, during the sensing and amplifying operation, the relatively lower low voltage VBB_L is used for more reliable isolation between the bit line sense amplifier and a bit line coupled to a cell array and, then, the relatively higher low voltage VBB_H is used for the isolation between the bit line sense amplifier and the bit line coupled to the cell array during other operations. This is for the bit line sense amplifier to perform the sensing and amplifying operation more quickly by using the low voltage VBB_H when the bit line sense amplifier mainly performs the sensing and amplifying operation.

Thereafter, when the sensing and amplifying operation of the bit line sense amplifier 210 is completed, an input/output control signal Y1 is activated for a predetermined time. Then, in response to the input/output control signal Y1, a data signal latched by the bit line sense amplifier 210 is outputted to the data line pair LDB and LDBB (t3). This outputted data is a corresponding data of the read command.

Thereafter, at the restore step, the data signal is restored to an original unit cell by using the data signal latched by the bit line sense amplifier 210 (t4). When the restore step is completed, a word line WL is in activated having a voltage level of the power supply voltage, and the first and the second sense amplifier power supply terminals SAP and SAN are respectively supplied with the ground voltage GND and a half of the power supply voltage VDD so that the bit line sense amplifier 210 is disabled.

Since the data line pair LDB and LDBB is precharged to the power supply voltage VDD or a half of the power supply voltage VDD while a data is not transferred, according to the prior art, a voltage level of a bit line (SA_/BL in this case) amplified to the ground voltage by the bit line sense amplifier 210 is increased to predetermined voltage level during transferring a data sensed and amplified by the bit line sense amplifier 210. Accordingly, an enough time for the restore time should be provided for the increased voltage level of the bit line /BL to be decreased to the ground voltage. Otherwise, a wrong data can be restored to the original unit cell; particularly, if an original data is '0', the original data is restored as '1'. For overcoming the above-mentioned problem, a period of the restore step (t4) should be long according to the prior art.

However, in accordance with the present invention, since the bit line SA_BL is amplified to the low voltage VBB which is lower than the ground voltage GND, even though a current is flown to the bit line /BL coupled to the bit line sense amplifier by the data line pair LDB and LDBB, a voltage level of the bit line /BL coupled to the bit line sense amplifier is not increased because the flown current is compensated by the bit line having the low voltage VBB. Even though the voltage level of the bit line /BL is increased, the increased voltage level of the bit line /BL is not higher than a voltage level of the ground voltage GND at least. Accordingly, the period of the restore step (t4) can be decreased in comparison with the prior art.

Thereafter, when the precharge signal BLEQ_H is activated as a logic high level, the bit lines BL and /BL have a same voltage level and are floated. Also, the first and the second connection signals BISH and BISL are provided as the low voltage VBB_H and, thus, all of the bit lines BL, SA_BL, Bot_BL, /BL, SA_/BL and /Bot_BL are connected (t5).

As above-mentioned, at an initial state of the precharge step, the bit lines BL and /BL keep a voltage level of a half of the power supply voltage; however, the voltage level of the bit lines BL and /BL is decreased as time passes because the bit lines BL and /BL are floated not receiving a particular precharge voltage.

Meanwhile, while the first connection unit 250a is enabled, the second reference cell block 400b and the second precharge unit 220b are enabled so that a voltage level of the second bit line Bot_BL and the second bit line bar /Bot_BL is maintained as a precharge voltage. In accordance with the present invention, while voltage levels of a bit line pair are maintained to have a same voltage level at the precharge step, the bit line pair is floated not being supplied with a special precharge voltage. Therefore, there is no particular precharge voltage which all of the bit lines keep at the precharge step.

However, the precharge voltage means a half of the power supply voltage which a bit line pair keeps when the bit line pair has a same voltage level after one of the bit line pair has a voltage level of the power supply voltage and the other has a voltage level of the ground voltage after performing a data read or write operation. That is, while the bit line sense amplifier 210 accesses a data of a unit cell, a voltage level of a bit line pair which shares the bit line sense amplifier 210 and is not connected to the bit line sense amplifier 210 is maintained as the half of the power supply voltage by using a corresponding precharge unit and a reference cell block. Since a voltage level of a bit line included in an inactivated cell array is rapidly decreased due to a voltage difference between the power supply terminal (SAN) of the bit line sense amplifier which operates for accessing a data and a voltage level of the bit line included in the inactivated cell array, the above-mentioned operation is needed.

Although transistors which receive the first or the second connection control signals BISL or BISH are provided between the power supply terminal SAN and the inactivated cell array, and even though the transistors are turned off, a sub-current still flows and a voltage level of the bit line included in the inactivated cell array is rapidly decreased due to a leakage current of the sub-current. If a size of the transistor is smaller, the above-mentioned problem becomes more serious.

Generally, a semiconductor memory device keeps a precharge voltage as VDD/2. Herein, in a shared structure, when the bit line sense amplifier senses and amplifies a voltage difference between a bit line pair coupled to one side of the bit line amplifier for a data accessing, the other bit line pair which does not serve to access a data and is coupled to the other side of the bit line sense amplifier keeps a precharge voltage level of VDD/2. However, there occurs an error since the precharge voltage level is decreased due to a voltage difference between the precharge voltage and a ground voltage supply terminal of a bit line.

In accordance with the present invention, since a bit line pair which does not serve to access a data is floated at the precharge step, the above-mentioned problem does not occur. However, if the precharge voltage is maintained as a VDD/2, a data access operation can be performed more effectively since the precharge voltage level of VDD/2 is the most effective for sensing a high-level data and a low-level data.

Since the semiconductor memory device in accordance with the present invention maintains a voltage level of a bit line pair which neighbors with a bit line pair served for a data access as the VDD/2 by using a reference cell block and a precharge unit, all of bit line pairs which neighbor with the data accessing bit line pair can keep a voltage level of VDD/2. Accordingly, a precharge voltage can be secured not generating a particular control signal.

The above-mentioned operation of the semiconductor memory device is described on the assumption that a data '1' is read out. Hereinafter, an operation of the semiconductor memory device for read a data '0' is described below.

In case that a data to be read is '0', a capacitor of a selected unit cell is in a discharged state. Accordingly, a voltage level of the first bit line BL receiving a data signal is not changed at the read step after the precharge step (t2). That is, a voltage level of the first bit line BL keeps a voltage level of the ground voltage.

Meanwhile, since the first bit line bar /BL receives a reference signal, a voltage level of the first bit line bar /BL is increased by a predetermined voltage level. Herein, an amount of the voltage increase of the first bit line bar /BL is determined by a charge quantity corresponding to the reference signal, i.e., a charge quantity stored in the reference capacitor Top_RC.

Thereafter, the bit line sense amplifier 210 senses the voltage difference between the first bit line BL and the first bit line bar /BL and amplifies a voltage level of the bit line BL and a voltage level of the first bit line bar /BL to the low voltage VBB and to the power supply voltage VDD respectively, then, the bit line sense amplifier 210 latches the amplified voltage levels. Herein, a voltage level of the first bit line BL included in the first cell array 300a is maintained as the ground voltage by the first connection unit 250a.

Since the remaining operations for reading '0' is same to that for reading '1', detailed descriptions are omitted.

Hereinafter, an operation of the semiconductor memory device for writing a data is described below.

The write operation is very similar to the read operation. While a data signal sensed and amplified by the bit line sense amplifier 210 is outputted to the data line pair LDB and LDBB during t3 at the read operation, a data signal inputted according to a write command is transferred to the bit line sense amplifier 210 through the bit line sense amplifier 210 at the write operation.

Then, the bit line sense amplifier 210 replaces a previously latched data signal with the delivered data signal, and the newly latched data signal is stored to a unit cell at the restore step (t4). The bit line sense amplifier 210 also performs a sensing and amplifying operation by using the power supply voltage VDD and the low voltage VBB at the write operation.

As above-mentioned, the semiconductor memory device floats a bit line at the precharge step, and the bit line sense amplifier 210 senses and amplifies a voltage difference between two bit lines BL and /BL by using the power supply voltage VDD and the low voltage VBB.

Effective advantages of the semiconductor memory device in accordance with the present invention are described below.

Firstly, since a unit cell included in a cell array is embodied with a PMOS transistor, a leakage current of a unit cell is reduced and, thus, refresh characteristics can be improved.

Secondly, since a particular precharge voltage is not needed to be supplied at the precharge step, a power consumption at the precharge step can be reduced. That is, according to the prior art, since a power supply voltage or a half of a power supply voltage is provided for the precharge step, a predetermined amount of power is consumed. However, since the semiconductor memory device in accordance with the present invention does not need an additional power for the precharge step, a power consumption can be dramatically reduced.

Thirdly, a bleed current caused by a short-circuit between a word line and a bit line of a unit cell can be prevented. Since the bleed current is still generated after a defective word line is replaced with a redundancy word line, a power is unnecessarily consumed. However, in accordance with the present invention, there is no particular precharge voltage for a bit line, and the bit line is floated. Therefore, the bit line has a voltage level of a ground voltage and, thus, the bleed current can be prevented because there is no voltage difference between a word line and a bit line. Herein, at an initial state of the precharge step, since a bit line has a predetermined voltage level, a little bleed current may be generated; however, the bleed current is not generated after a voltage level of the floated bit line becomes a ground voltage.

Also, a word line has a voltage level of the power supply voltage during the precharge step, and a word line coupled to a unit cell which generates a bleed current is substituted with a redundancy word line. Therefore, the substituted word line has the voltage level of the ground voltage and, thus, the voltage difference between a word line and a bit line is not maintained during the precharge step.

Fourthly, since a bit line sense amplifier performs a sensing and amplifying operation by using the power supply voltage VDD and the low voltage VBB which is lower than the ground voltage, a data signal delivered to a bit line can sensed and amplified by a bit line sense amplifier at a high speed even though the power supply voltage VDD is low. Also, an absolute quantity of the low voltage VBB may be same to that of the power supply voltage VDD as an operational voltage of the semiconductor memory device is decreased. In this case, a half of the power supply voltage VDD becomes the ground voltage. Accordingly, the bit line sense amplifier amplifies a high-level data and a low level data to the power supply voltage VDD and to the low voltage VBB respectively and, then, at the precharge step, a voltage level of a bit line pair is maintained as the ground voltage VSS if the bit line pair is controlled to have a same voltage level.

Fifthly, according to the prior art, since the precharge voltage level is the power supply voltage or a half of the power supply voltage, a current is flown from a data line to a bit line and, thus, a voltage level of a bit line amplified to a low level is temporarily increased. However, in accordance with the present invention, since the bit line sense amplifier amplifies a voltage level of a bit line to a negative low voltage, the current flown from the data line is compensated by the negative low voltage. Therefore, a voltage level of the bit line is not increased more than the ground voltage. As a result, a period of the restore step can be decreased and a cycle time also can be decreased.

Sixthly, since each of a unit cell, the precharge unit and the reference cell block is embodied with a PMOS transistor, PMOS transistors for a unit cell, the precharge unit and the reference cell block can be laid out using a single n-well.

Lastly, since the semiconductor memory device is operated by using a low voltage and not using a high voltage, a power consumption for generating the high voltage can be reduced (There is no high voltage generator in the semiconductor memory device in accordance with the preferred embodiment of the present invention). That is, an absolute quantity of the low voltage is smaller than that of the high voltage and characteristics of the low voltage is better than that of the high voltage.

As a result, in accordance with the present invention, the semiconductor memory device can perform a data access operation at a high speed under a low operational voltage.

Meanwhile, since the semiconductor memory device uses the low voltage VBB for a data access operation, a reliable low voltage generator is required. Particularly, for stably supplying the low voltage which is lower than the ground voltage to many parts of each bank, a storing capacitor having a very large capacitance is needed.

In accordance with the preferred embodiment of the present invention, the storing capacitor is embodied by using a Yi signal generated by a Y-decoder instead using a PMOS transistor and an NMOS transistor.

Herein, the Yi signal is a control line for delivering a data, which is latched after being sense and amplified by the bit line sense amplifier, to an external data line. Since the control line is laid out in a cell array as a metal line, the control line has a capacitance of about 1.0 pF per each column line. Generally, since more than 2000 numbers of Yi signal lines are included in each bank, there is a capacitance of at least 2 nF in each bank. On the assumption that 4 banks are included in the semiconductor memory device, a capacitor having a capacitance of at least 8 nF can be obtained. Therefore, by using this capacitor as the storing capacitor of the low voltage generator, lots of capacitors are not needed.

Figure 7:
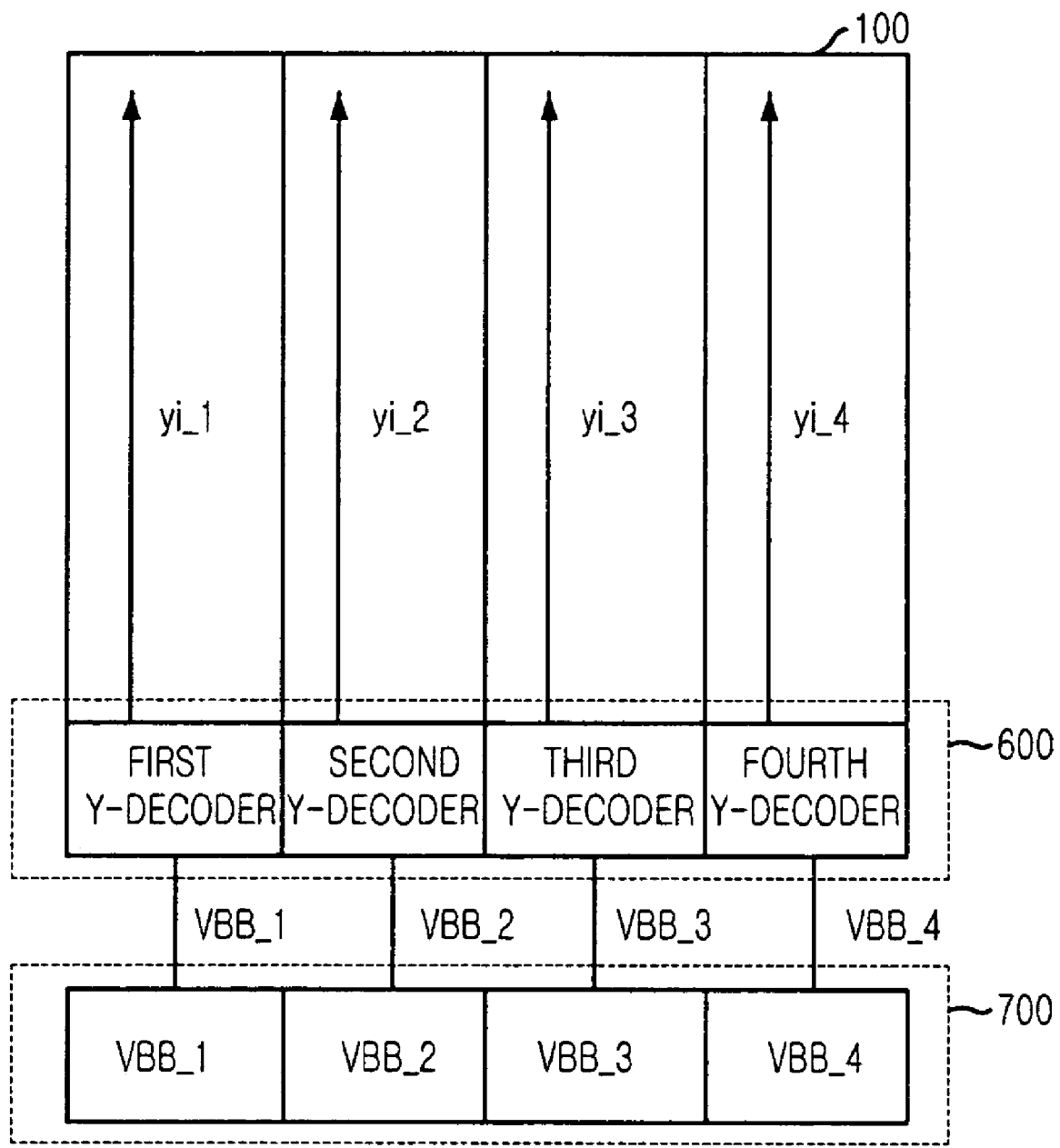
FIG. 7 is a block diagram showing a Y-decoding unit included in a single bank.

FIG. 7 is a block diagram showing a Y-decoding unit included in a single bank.

As shown, a low voltage generation unit 700 is provided to a Y-decoding unit 600. The low voltage generation unit 700 includes a first to a fourth unit Y-decoders. Herein, the Y-decoding unit 600 also includes four unit low voltage generators corresponding to the first to the fourth unit Y-decoders in order to generate four different levels of low voltage. Each low voltage is used for various operations.

Figure 8:
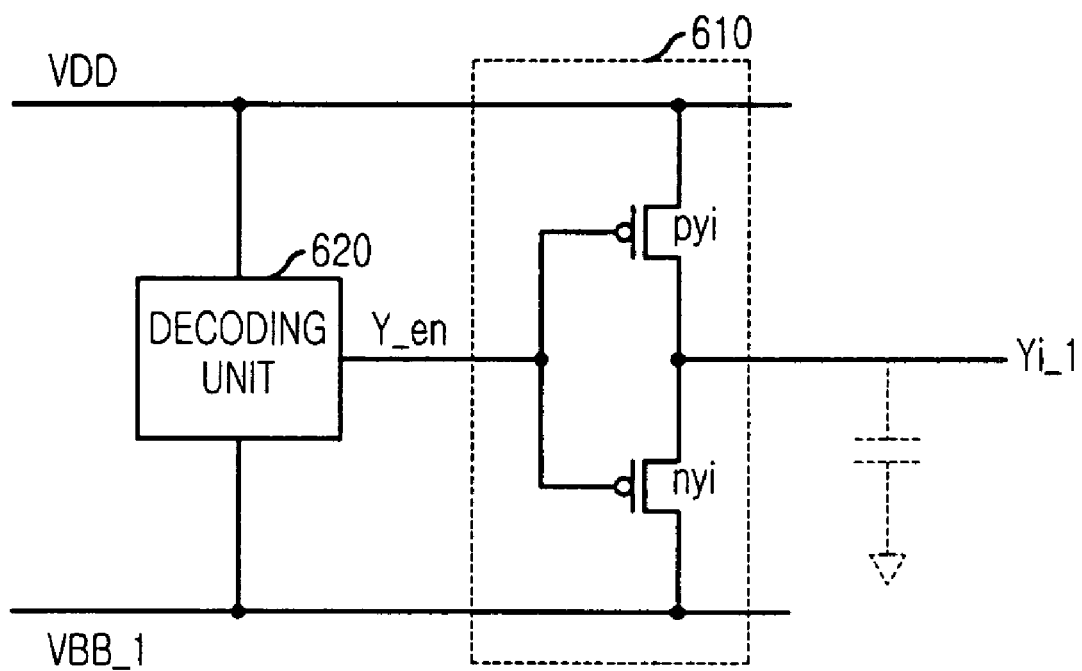
FIG. 8 is a schematic circuit diagram depicting a unit Y-decoder shown in FIG. 7.

FIG. 8 is a schematic circuit diagram depicting a unit Y-decoder shown in FIG. 7.

As shown, the unit Y-decoder includes a decoding unit 620 for decoding an address in order to generate a decoded signal Y_en; and a driving unit 610 for receiving the decoded signal Y_en in order to generate a Yi_1 signal. Herein, there exists a parasitic capacitor Cyi at an output terminal for outputting the Yi_1 signal. The parasitic capacitor is used as the storing capacitor for generating the low voltage.

When the decoded signal Y_en is in a logic high level, an NMOS transistor nyi is turned on. Therefore, since the output terminal for outputting the Yi_1 signal is connected to a low voltage supply terminal VBB_1, the low voltage supply terminal VBB_1 is connected to the parasitic capacitor Cyi.

Since the decoded signal Y_en should be in a logic high level for inactivating the Yi_1 signal, the parasitic capacitor Cyi is basically connected to the low voltage supply terminal VBB_1. Meanwhile, in case that the Yi_1 is activated, the parasitic capacitor Cyi is disconnected from the low voltage supply terminal VBB_1. However, in this case, only partial Yi signals transitions to a high pulse and, then, becomes a logic low level again because the Yi signal is activated only when a data sensed and amplified by the bit line sense amplifier is delivered to a data line.

Figure 9:
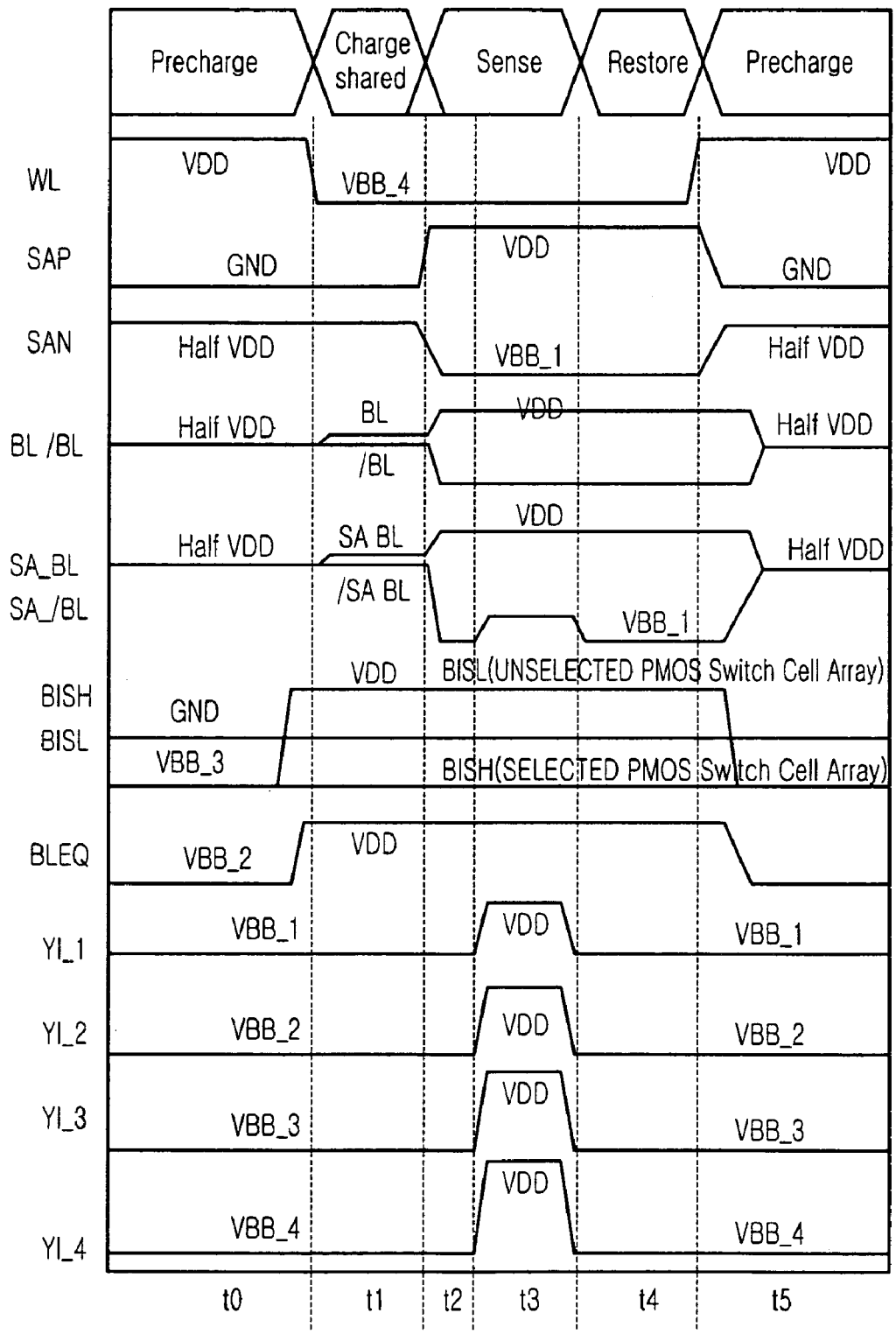
FIG. 9 is a timing diagram showing an operation of the semiconductor memory device shown in FIGS. 7 and 8.

FIG. 9 is a timing diagram showing an operation of the semiconductor memory device shown in FIGS. 7 and 8.

The operation of the semiconductor memory device is very similar to the operation shown in FIG. 6 except that the low voltage has different four voltage levels.

That is, FIG. 9 shows the operation of the semiconductor memory device in case of using four different levels of the low voltage. Herein, an absolute quantity of a first low voltage VBB_1 is the lowest and an absolute quantity of a fourth low voltage VBB_4 is the highest.

The first low voltage VBB_1 is supplied to the sense amplifier power supply terminal SAN and the fourth low voltage VBB_4 is supplied to a word line. The second low voltage VBB_2 is used as the precharge signal BLEQ and the third low voltage VBB_3 is used as the connection control signals BISH and BISL. That is, since each circuit which is supplied with the low voltage requires different optimum low voltage level, various levels of the low voltage are generated.

Meanwhile, if the signals Yi_1 to Yi_4 respectively generated by the first to the fourth unit Y-decoders are lower than the first low voltage VBB_1 supplied to the sense amplifier power supply terminal SAN, there is no problem for keeping an off state of an output terminal of the bit line sense amplifier. Therefore, even though each absolute quantity of the second to the fourth low voltages VBB_2 to VBB_4 connected to signals Yi_2 to Yi_4 except for the signal Yi_1 is increased, there is not problem for keeping an off state of MOS transistor included in a Y-decoder.

As a result, since the storing capacitor for generating the low voltage is embodied by using the parasitic capacitor generated at a decoding line of the Y-decoder, the storing capacitor having an enough capacitance can be provided without a particular circuit.

The present application contains subject matter related to Korean patent application No. 200-, filed in the Korean Patent Office on, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a first cell block having a plurality of unit cells for providing a data signal included in a unit cell through a corresponding bit line pair;
   a plurality of bit line sense amplifying blocks for sensing and amplifying the data signal delivered to the corresponding bit line pair by using the power supply voltage and a low voltage which is lower than the ground voltage;
   a decoding unit for generating a plurality of decoding signals to provide the plurality of decoding signals into the plurality of bit line sense amplifying blocks respectively in order to deliver the sensed and amplified data signal to a data line; and
   a low voltage generation unit for generating the low voltage by using a parasitic capacitor generated at a signal line of the decoding signal as a storing capacitor.

2. The semiconductor memory device as recited in claim 1, further comprising a second cell block having a plurality of unit cells for providing a data signal included in a unit cell through a corresponding bit line pair, each unit cell being constituted with a PMOS transistor and a capacitor.

3. The semiconductor memory device as recited in claim 2, wherein the bit line sense amplifying block includes:
   a bit line sense amplifier for sensing and amplifying a voltage difference between the corresponding bit line pair;
   a first connection unit for connecting the first cell block to the bit line sense amplifier; and
   a second connection unit for connecting the second cell block to the bit line sense amplifier.

4. The semiconductor memory device as recited in claim 3, wherein the first connection unit includes:
   a first PMOS transistor for receiving a first connection control signal through a gate of the first PMOS transistor in order to connect a bit line of a bit line pair which corresponds to the first cell block to the bit line sense amplifier; and
   a second PMOS transistor for receiving the first connection control signal through a gate of the second PMOS transistor in order to connect a bit line bar of the bit line pair which corresponds to the first cell block to the bit line sense amplifier.

5. The semiconductor memory device as recited in claim 4, wherein the second connection unit includes:
   a third PMOS transistor for receiving a second connection control signal through a gate of the third PMOS transistor in order to connect a bit line of a bit line pair which corresponds to the second cell block to the bit line sense amplifier; and
   a fourth PMOS transistor for receiving the second connection control signal through a gate of the fourth PMOS transistor in order to connect a bit line bar of the bit line pair which corresponds to the second cell block to the bit line sense amplifier.

6. The semiconductor memory device as recited in claim 5, wherein the low voltage generation unit generates a first low voltage which is lower than the ground voltage and a second low voltage which has a voltage level between the first low voltage and the ground voltage, wherein the first low voltage is used for driving the bit line sense amplifier and the second low voltage is used for activating the first and the second connection control signals.

7. The semiconductor memory device as recited in claim 5, wherein the bit line sense amplifying block further includes:
   a first precharge unit for equalizing voltage levels of the bit line pair corresponding to the first cell block during a precharge operation; and
   a second precharge unit for equalizing voltage levels of the bit line pair corresponding to the second cell block during the precharge operation.

8. The semiconductor memory device as recited in claim 7, wherein the first precharge unit includes a fifth PMOS transistor connected between the bit line pair corresponding to the first cell block, wherein a gate of the fifth PMOS transistor receives a precharge signal.

9. The semiconductor memory device as recited in claim 8, wherein the second precharge unit includes a sixth PMOS transistor connected between the bit line pair corresponding to the second cell block, wherein a gate of the sixth PMOS transistor receives the precharge signal.

10. The semiconductor memory device as recited in claim 9, wherein the low voltage generation unit generates a first to a fourth low voltages which are lower than the ground voltage, wherein the first low voltage whose absolute quantity is the smallest is used for driving the bit line sense amplifier, the second low voltage whose absolute quantity is larger than that of the first low voltage is used for activating the precharge signal, the third low voltage whose absolute quantity is larger than that of the second low voltage is used for activating the first and the second connection control signals and the fourth low voltage whose absolute quantity is the largest is used for activating a MOS transistor included in the unit cell.

11. The semiconductor memory device as recited in claim 1, wherein the decoding unit includes a plurality of unit decoders corresponding to the plurality of bit line sense amplifying blocks for providing predetermined decoding signals among the plurality of decoding signals.

12. The semiconductor memory device as recited in claim 11, wherein the unit decoder includes:
   a decoder for decoding an inputted address in order to generate an enable signal; and
   a driving unit for generating a decoding signal by inverting the enable signal,
   wherein the driving unit including:
      a PMOS transistor whose gate receives the enable signal for receiving the power supply voltage through one terminal of the PMOS transistor in order to pull-up the decoding signal; and
      an NMOS transistor whose gate receives the enable signal for receiving the low voltage through one terminal of the NMOS transistor in order to pull-down the decoding signal.

13. The semiconductor memory device as recited in claim 12, wherein the low voltage generation unit, having a plurality of unit low voltage generators corresponding to the plurality of unit decoders, outputs one of a plurality of low voltages which are lower than the ground voltage and have different voltage levels, wherein a parasitic capacitor generated by a decoding signal outputted from a corresponding unit decoder is used as a storing capacitor of a low voltage signal generated by a corresponding unit low voltage generator.

14. The semiconductor memory device as recited in claim 1, wherein each unit cell is constituted with a PMOS transistor and a capacitor.

15. The semiconductor memory device as recited in claim 1, wherein a plurality of bit line sense amplifying blocks are corresponding to a plurality of bit line pairs.

* * * * *